(12) United States Patent
Belady et al.

(10) Patent No.: US 7,646,109 B2
(45) Date of Patent: Jan. 12, 2010

(54) SYSTEM FOR DISTRIBUTING AC POWER WITHIN AN EQUIPMENT RACK

(75) Inventors: Christian L. Belady, McKinney, TX (US); Bradley D. Winick, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 639 days.

(21) Appl. No.: 11/179,920

(22) Filed: Jul. 12, 2005

(65) Prior Publication Data

US 2007/0013233 A1 Jan. 18, 2007

(51) Int. Cl.
*H02J 3/26* (2006.01)

(52) U.S. Cl. .................................................. 307/14
(58) Field of Classification Search ............... 307/12, 307/13, 14
See application file for complete search history.

(56) References Cited

U.S. PATENT DOCUMENTS

| | | | | |
|---|---|---|---|---|
| 5,281,859 A | * | 1/1994 | Crane | 307/139 |
| 6,239,512 B1 | * | 5/2001 | Henderson et al. | 307/43 |
| 6,541,720 B2 | * | 4/2003 | Gerald et al. | 200/51.05 |
| 6,628,009 B1 | * | 9/2003 | Chapel | 307/14 |
| 2004/0000815 A1 | * | 1/2004 | Pereira | 307/11 |

OTHER PUBLICATIONS

Pulizzi Engineering, Inc., PC 975: 120/208V-WYE 3Ø, 50/60 Hz, 30A, Copyright 2004 Pulizzi Engineering, Inc., 2 pp.

* cited by examiner

*Primary Examiner*—Albert W Paladini
*Assistant Examiner*—Michael Rutland Wallis

(57) ABSTRACT

A system comprises a first equipment rack, a power distribution unit (PDU) and a plurality of rack connectors. The PDU is mounted in the first equipment rack and is configured to provide alternating current (AC) power that comprises a plurality of phases. The plurality of rack connectors mount within the first equipment rack, and each of the plurality of rack connectors couples to the PDU and provides access to the plurality of phases. Each rack connector is usable to accommodate a first device installed in the equipment rack that uses one or more of the plurality of phases, and is also usable to accommodate a second device installed in the equipment rack that uses one or more of the plurality of phases, thereby permitting each rack connector to couple to any of a plurality of devices, and permitting each of the plurality of devices to use any number of the plurality of phases. The number of phases used by the first device differs from the number of phases used by the second device.

23 Claims, 5 Drawing Sheets

US 7,646,109 B2

SYSTEM FOR DISTRIBUTING AC POWER WITHIN AN EQUIPMENT RACK

BACKGROUND

As datacenters have increased in size and complexity, the number and variety of computer equipment rack configurations used in datacenters has also increased. This variety has brought with it an equally diverse set of alternating current (AC) power requirements. Each rack configuration may require different voltages (e.g., 120V, 208V, 220, and 240V), as well as different power phase configurations (e.g., single-phase and Delta or Wye three-phase). The power cabling to each rack may also differ based on these requirements. If upgrades are made later to the devices installed within a rack, it may be necessary to change the power cabling providing power to the rack, due to changes in the power requirements of the new devices.

Differences and changes in power requirements not only may affect how power is provided to each rack within a datacenter, but may also have similar effects on the how power is distributed within each of the racks. Different devices within a rack may have different power requirements, necessitating different power cables and connectors within the rack. As requirements change and devices are upgraded or replaced, it may become necessary to change the wiring and/or connectors that connect the devices to the power distribution system within a rack.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies or data centers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Further, the term "system" refers to a collection of two or more parts and may be used to refer to a power distribution system or a portion of a power distribution system.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Equipment racks provide not only mechanical support for the devices installed within them, but also the electrical power necessary to operate the devices within them. A variety of configurations are used to provide power, comprising different voltages (e.g., 380V, 240V, 208V, 200V and 120V) and different combinations of phases (e.g., single-phase, 2-phase, and 3-phase). If the power requirements of one or more installed devices changes, some configurations avoid the need to alter or rewire either the cabling connecting power to the rack, or the power distribution cabling within the rack.

Figure 1:
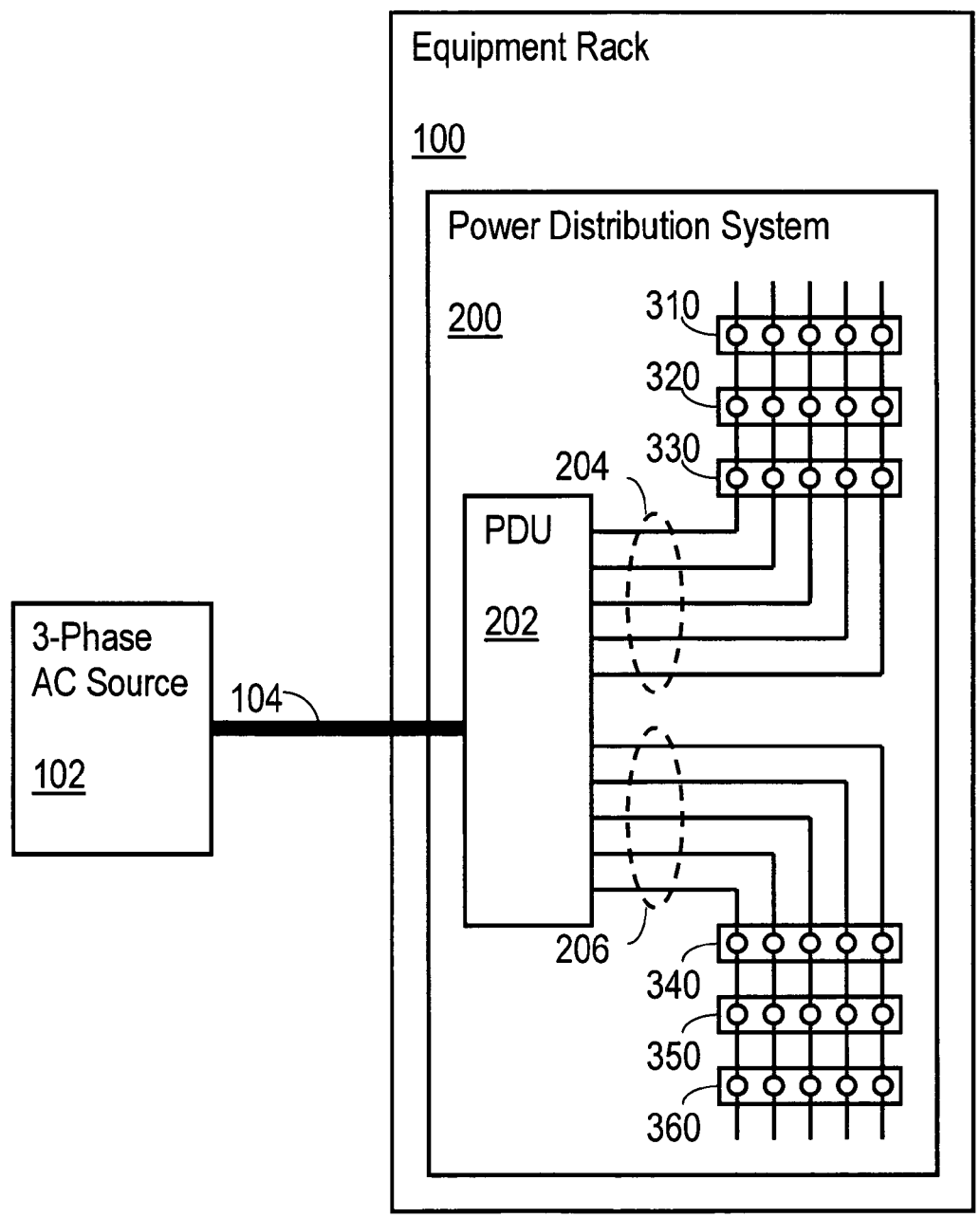
FIG. 1 shows a block diagram of an equipment rack comprising a power distribution system constructed in accordance with at least some embodiments.

FIG. 1 illustrates a block diagram of a power distribution system 200 incorporated into an equipment rack 100. A 3-phase alternating current (AC) power source 102 provides power to the equipment rack 100 using a 5-conductor cable 104. Three of the conductors provide AC power at a nominal level of 120 volts RMS with respect to a fourth neutral conductor, each conductor carrying one of three phases, and each phase nominally 120 degrees out of phase with each other. The fifth conductor of the cable 104 provides a protective earth path. Cable 104 couples to power distribution unit (PDU) 202 within the power distribution system 200 of equipment rack 100. PDU 202 may be used to provide a number of functions, such as fusing, branching, isolation, surge protection, and ground fault detection. In the embodiment of FIG. 1, for example, the PDU 202 branches the main power feed from cable 104 into two separate circuits 204 and 206. Additional PDUs (not shown) may be added to provide more branches, or to provide redundant power when coupled to additional redundant power feeds.

Each of the branched circuits 204 and 206 couple to a plurality of rack-mounted connectors 310-360. These rack-mounted connectors 310-360 make all three phases (plus the neutral and earth ground paths) available to any device that is installed in the rack. A device installed in the rack may comprise a device-mounted connector that mates to a rack-mounted connector. The mated connectors couple the installed device to one of the branched circuits (i.e., branched circuit 204 or 206). The device-mounted connector may be configured to select one, two, or all three phases, depending on the power requirements of the installed device. By using rack-mounted connectors with a fixed configuration in concert with configurable device-mounted connectors, changes in the power requirements of the device may be accommodated without changing the wiring of either of the branched circuits 204 and 206, or the cable 104.

Figure 2A:
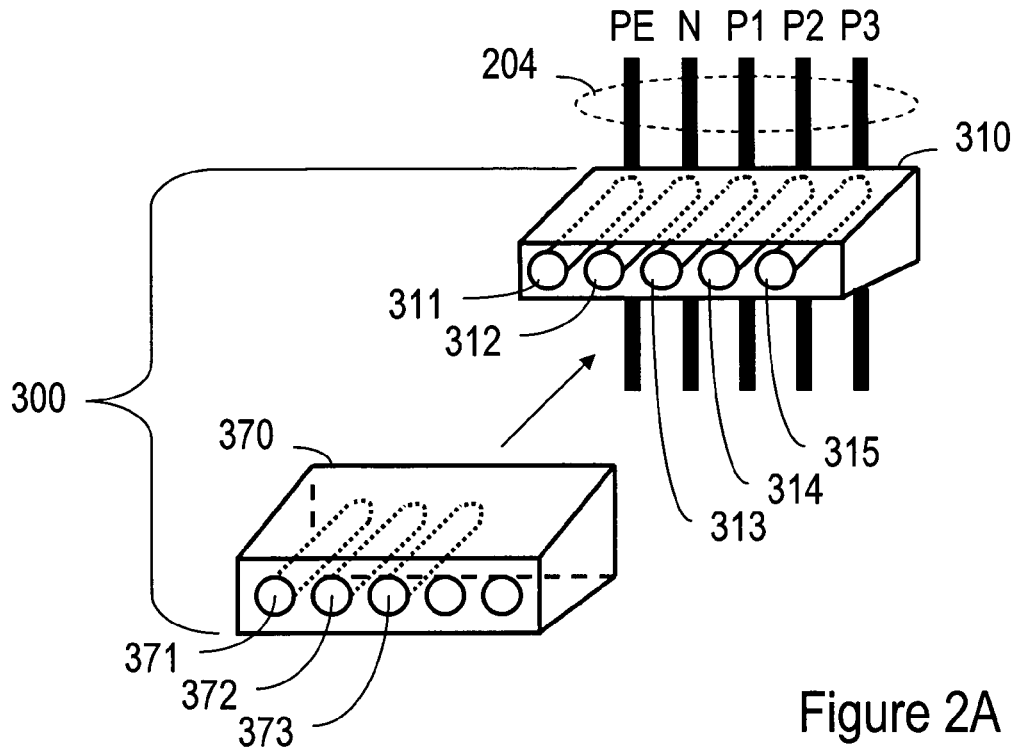
FIG. 2A shows a connector pair configured for single-phase, 120V AC operation, usable in a power distribution system constructed in accordance with at least some embodiments.

FIG. 2A illustrates a rack-mounted/device-mounted connector pair 300 constructed in accordance with at least some embodiments. The rack-mounted connector 310 mounts within equipment rack 100 and comprises a plurality of pins 311 through 315, each mounted within the rack-mounted connector 310. In the example shown each pin couples to a conductor within branched circuit 204. In some embodiments, branched circuit 204 comprises five conductors: phase 1 (P1), phase 2 (P2), phase 3 (P3), a neutral (N), and a protective earth (PE). The device-mounted connector 370 mounts to a device (not shown) mountable within the equipment rack 100 of FIG. 1. Continuing to refer to FIG. 2, the device-mounted connector 370 is adapted to mate with the rack-mounted connector 310, and comprises pins coupled to conductors (not shown) that provide power to the device. The number of pins within device-mounted connector 370, however, is configurable and may vary depending on the power requirements of the device. The device-mounted connector 370 shown in FIG. 2A, for example, comprises three pins 371 through 373. When the device-mounted connector mates with the rack-mounted connector as shown, pins 371, 372 and 373 couple a protective earth, a neutral, and phase 1 to the device. The example shown in FIG. 2A would thus result in providing single-phase 120V RMS AC power to the device.

Figure 2B:
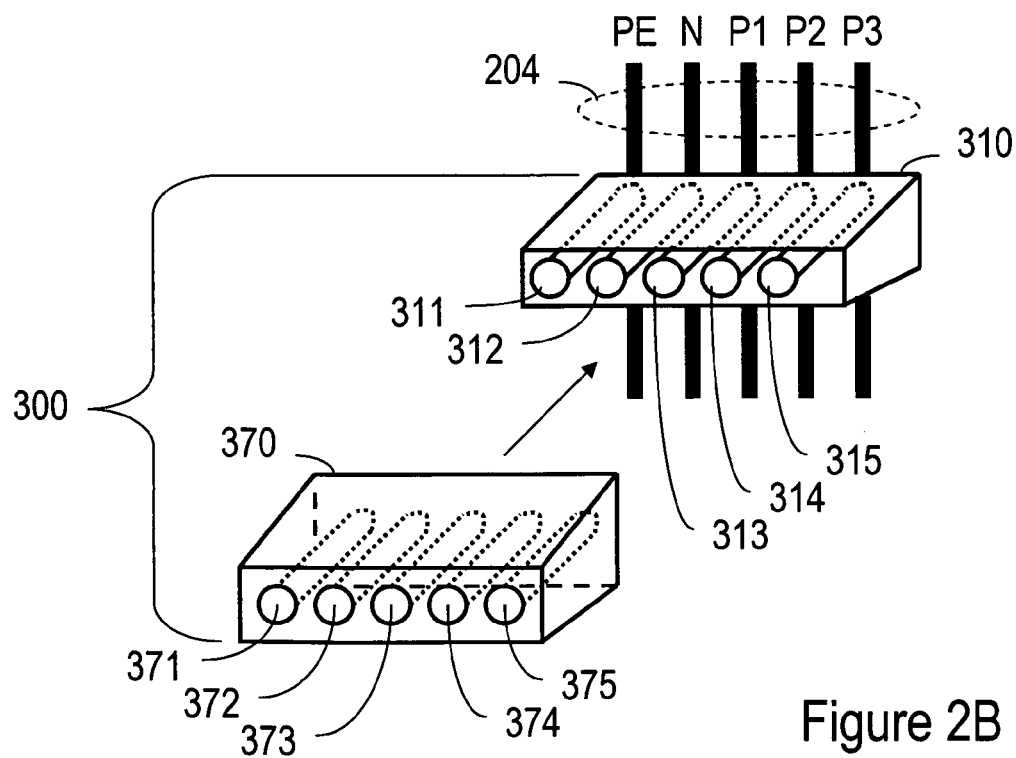
FIG. 2B shows a connector pair configured for three-phase, 208V AC operation, usable in a power distribution system constructed in accordance with at least some embodiments.

In the embodiment illustrated in FIG. 2B the rack-mounted connector 310 is configured in the same manner as in FIG. 2A, but the device-mounted connector 370 is configured differently and provides an illustrative three-phase 208V RMS AC power to the device. In this configuration, pins 371, 372, 373, 374, and 375 couple the protective earth, the neutral, phase 1, phase 2, and phase 3 respectively to device. As illustrated in FIGS. 2A and 2B, the configuration of the device-mounted connector 370 thus determines how power is provided to the device. Changes in the power requirements of the device may be accommodated without altering the internal configuration of the rack 100 (e.g., the configuration of PDU 202 or the branched circuit 204 of FIG. 1), and without altering how power is provided to the equipment rack 100 (e.g., without alterations to the power source 102 or the cable 104 of FIG. 1).

Figure 3:
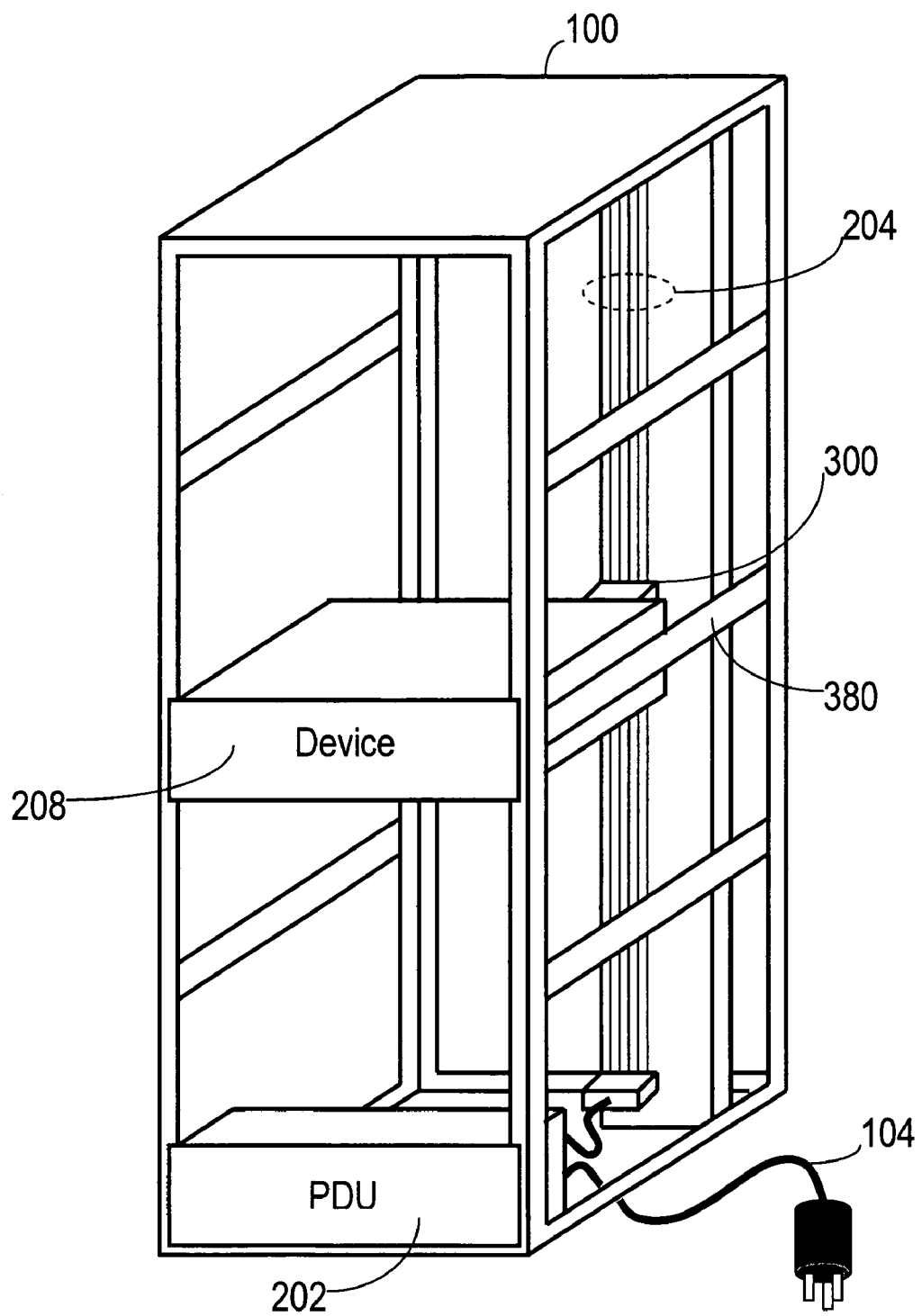
FIG. 3 shows an equipment rack comprising a power distribution system constructed in accordance with at least some embodiments.

The device-mounted connector 370 of FIG. 2 may be mounted to the device such that it mates with rack-mounted connector 310 when the device is mounted in equipment rack 100. Referring now to FIG. 3, mating may be accomplished, for example, by a combination of guide rails 380, and a rack-mounted/device-mounted connector pair 300. The guide rails 380 position the device 208 such that it can be inserted from the front of the equipment rack 100 and slid along the guide rails 380 towards the back of the equipment rack 100. As the device approaches the end of travel along the guide rails 380, the equipment-mounted half of connector 300 begins to mate with the rack-mounted half of connector 300 (coupled to branched circuit 204). At the end of travel along the guide rails 380 the two connector halves are fully mated. Once fully mated, power provided via cable 104, through PDU 202 and through branched bus 204 may be used to operate device 208. Other embodiments (not shown) may include additional branched circuits and connectors similar to branched circuit 204 and connector 300. Such additional branched circuits and connectors may provide additional or redundant power that may also be used to operate device 208.

The connector halves of connector 300 may thus be "blind-mated" or coupled to each other without the need to see them and manually align them. The positioning of the connector halves of connector 300, as well as the positioning of the guide rails 380, provides the necessary alignment to ensure proper mating. Tapered connector housings (as shown in FIGS. 2A and 2B) may also be used to allow for some error in alignment. Other mounting and mating systems may become apparent to those skilled in the art, and this disclosure is intended to encompass all such variations. For example, a device 208 that does not incorporate the device-mounted connector 370 of FIG. 2 may instead use an adaptor cable (not shown) to couple the device 208 to the rack-mounted connector 310.

Figure 4:
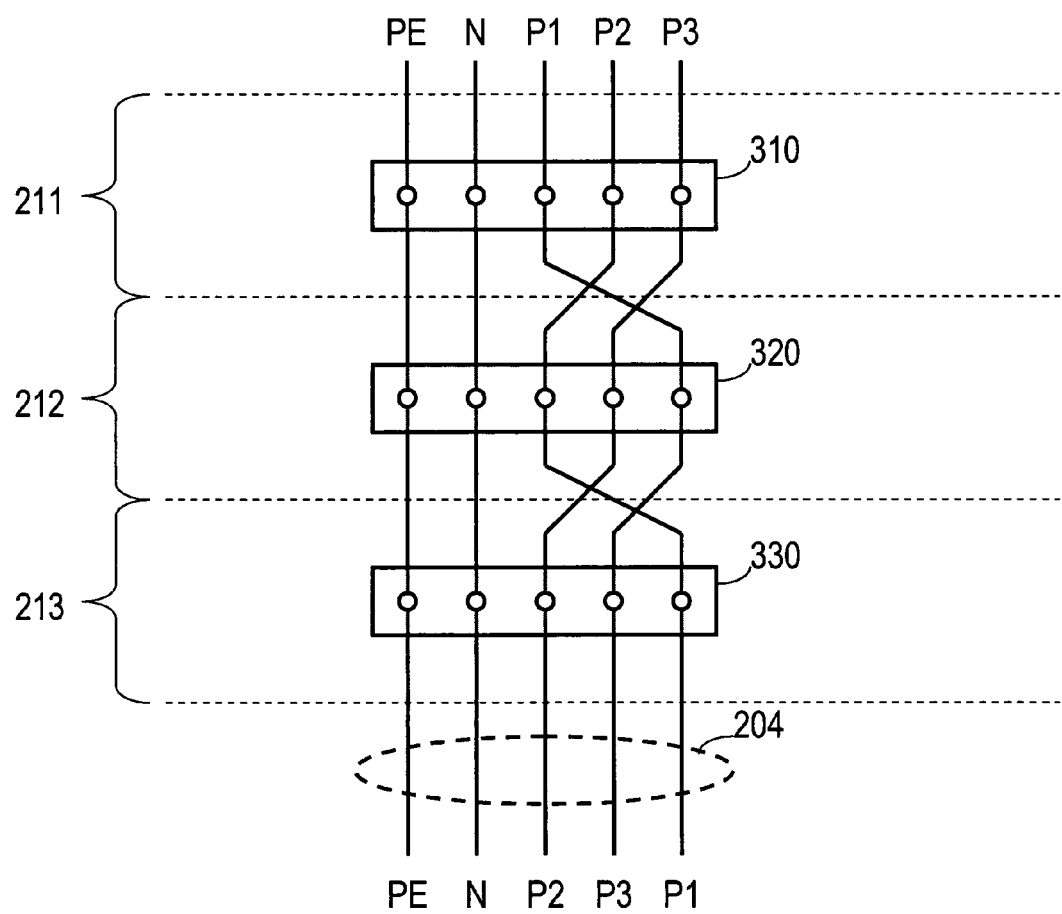
FIG. 4 shows a phase-balancing wiring scheme usable in a power distribution system constructed in accordance with at least some embodiments.

The power distribution system 200 of the equipment rack 100 may also be configured so as to provide the capability of load-balancing the various phases of the multi-phase power distributed within the rack 100. FIG. 4 illustrates a 3-phase load-balancing configuration in accordance with at least some embodiments. Three rack-mounted connectors 310 through 330 are shown coupled to branched circuit 204. Each rack-mounted connector is positioned at a different rack elevation levels (levels 211 through 213). The protective earth and neutral wires are coupled to the same pins on all three rack-mounted connectors, but the three phases (P1, P2, and P3) are each wired on different connector pins of a connector, for a given rack elevation level, than the pins of a connector mounted at an immediately adjacent elevation level. Thus, phase 2 couples to the center pin of the connector at rack elevation level 212, but is not coupled to the center pin of adjacent connectors 211 and 213. If, for example, a device that requires single-phase 120V power and uses a device-mounted connector that is configured to use a single power phase on the center pin, the device will use phase 1 when installed at rack elevation level 211, phase 2 when installed at rack elevation level 212, and phase 3 when installed at rack elevation level 213. Thus, if the device is installed at all three rack elevation levels, each using a single phase on pin 3, the total electrical load of the installed device will be distributed among the three phases of the 3-phase AC power provided. Other ordering schemes that distribute the loading of the various phases may become apparent to those skilled in the art, and this disclosure is intended to encompass all such variations.

Figure 5:
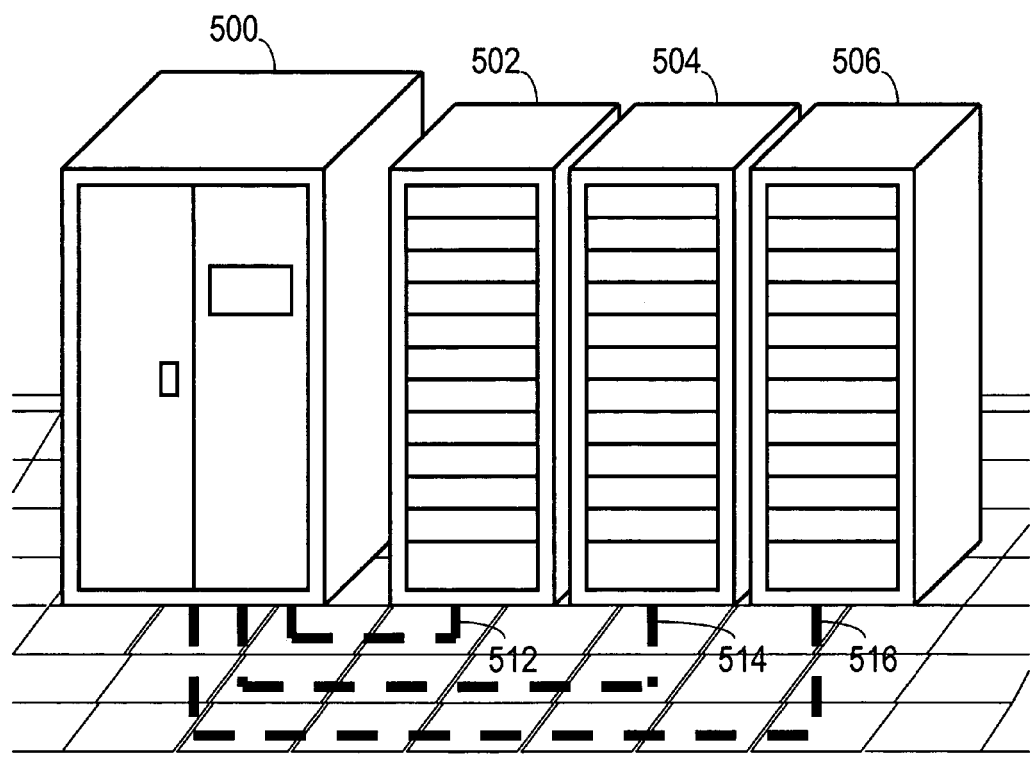
FIG. 5 shows part of a datacenter comprising a plurality of racks, each comprising a power distribution system constructed in accordance with at least some embodiments.

FIG. 5 illustrates a plurality of racks within a datacenter, each comprising a power distribution system 200. The power feed from the 3-phase AC power source 500 comprises the same configuration for each rack. In the example of FIG. 5, the racks 502, 504, and 506 each couple to the 3-phase AC power source 500 via power cables 512, 514, and 516 respectively. These cables each comprise 5 conductors which comprise three phases (1, 2, and 3), a neutral path, and a protective earth path. Because each cable is configured in the same manner and provides each of the racks 502 through 506 with power in the same way, the overall cabling of the data center is simplified. Since the individual racks can each accommodate a variety of power requirements by changing the configuration of a device-mounted connector, device upgrades and expansions may be possible within each of the racks 502 through 506 without modifying the power cables 512 through 516. Other embodiments (not shown) may also include additional power sources and power cables that may be used to provide additional or redundant power to each of the racks 502 through 506.

The above discussion is meant to be illustrative of the principles and various embodiments of the present invention. Numerous variations and modifications will become apparent to those skilled in the art once the above disclosure is fully appreciated. For example, although the embodiments shown receive power from a 3-phase, 208-volt source, other embodiments may use sources comprising a different number of phases, different phase configurations, and different operating voltages. These embodiments may comprise Delta or Wye phase configurations such as those used in the United States, Europe and Japan, and may be configured to accommodate any or all of these phase configurations and operating voltages. Further, any number of PDUs may be installed in an equipment rack, and such installation may comprise locations at any elevation at the front, back, or along the sides of the rack. It is intended that the following claims be interpreted to embrace all such variations and modifications.

What is claimed is:

1. A system, comprising:
   a first equipment rack;
   a power distribution unit (PDU) mounted in the first equipment rack, the PDU configured to provide alternating current (AC) power, the AC power comprises a plurality of phases; and
   a plurality of rack connectors mounted within the first equipment rack, each of the plurality of rack connectors couples to the PDU and provides access to the plurality of phases;
   wherein each rack connector is usable to selectively accommodate a first device having a single-phase power requirement and a second device having a multi-phase power requirement.

2. The system of claim 1, further comprising a device connector mounted to at least one of the devices, wherein a rack connector of the plurality of rack connectors and the device connector mate using a blind mating configuration.

3. The system of claim 1, wherein at least one of the devices is a computer or storage system.

4. The system of claim 1, wherein each rack connector is usable to selectively accommodate any one of three different single-phase power connections.

5. The system of claim 4, further comprising a third device having a single-phase power requirement, wherein the third device and the first device each connect to a separate rack connector using compatible device connectors and wherein the first and third devices receive different single-phase power by mating a common conductor configuration for each rack connector with a different pin configuration for each device connector.

6. The system of claim 4, further comprising a third device, wherein the third device and the first device each connect to a separate rack connector using compatible device connectors and wherein the first and third devices receive different single-phase power by mating rack connectors having different conductor configurations with device connectors having a common pin configuration.

7. The system of claim 1, wherein the AC power comprises three phases, each of the three phase nominally 120 degrees out of phase with respect to each other.

8. The system of claim 7, wherein each phase of the AC power has a nominal magnitude of 120 volts RMS with respect to a neutral conductor.

9. The system of claim 7, wherein each phase of the AC power has a nominal magnitude of 220 volts RMS with respect to a neutral conductor.

10. The system of claim 7, wherein each phase of the AC power has a nominal magnitude of 240 volts RMS with respect to each other phase.

11. The system of claim 7, wherein each phase of the AC power has a nominal magnitude of 200 volts RMS with respect each other phase.

12. The system of claim 1, further comprising:
   a multi-phase AC power source;
   a second equipment rack; and
   a power distribution wiring system comprising a plurality of power feeds, a first power feed of the plurality of feeds couples the multi-phase AC power source to the first equipment rack, and a second power feed of the plurality of power feeds couples the multi-phase AC power source to the second equipment rack;
   wherein the first power feed and the second power feed comprise substantially a same voltage configuration; and
   wherein the first power feed and the second power feed comprise substantially a same phase configuration.

13. The system of claim 1 wherein the first and second devices have device connectors that are configured to connect to the particular phases needed by the respective device.

14. A system, comprising:
   a first equipment rack;
   a power distribution unit (PDU) mounted in the first equipment rack, the PDU configured to provide alternating current (AC) power, the AC power comprises a plurality of phases;
   a plurality of rack connectors mounted within the first equipment rack, each of the plurality of rack connectors couples to the PDU and provides access to the plurality of phases;
   wherein each of the plurality of rack connectors comprises a plurality of pins, each pin of the plurality of pins providing access to one of the plurality of phases; and
   wherein a first ordering of the pins based on phase within each of the plurality of rack connectors is different than a second ordering of the pins based on phase of any other adjacent rack connector of the plurality of rack connectors.

15. The system of claim 14, wherein the overall electrical load supported by the first equipment rack is distributed substantially equally between the plurality of phases if substantially equivalent electrical loads are coupled to each of the plurality of rack connectors.

16. The system of claim 14, further comprising:
   a multi-phase AC power source;
   a second equipment rack; and
   a power distribution wiring system comprising a plurality of power feeds, a first power feed of the plurality of feeds couples the multi-phase AC power source to the first equipment rack, and a second power feed of the plurality of power feeds couples the multi-phase AC power source to the second equipment rack;
   wherein the first power feed and the second power feed comprise substantially a same voltage configuration and phase configuration.

17. The system of claim 16, wherein the multi-phase AC power source comprises three phases, each nominally 120 degrees out of phase with each other.

18. The system of claim 17, wherein the voltage of each phase of the multi-phase AC power source is nominally 120 volts with respect to a neutral conductor.

19. The system of claim 17, wherein the voltage of each phase of the multi-phase AC power source is nominally 220 volts with respect to a neutral conductor.

20. The system of claim 17, wherein the voltage of each phase of the multi-phase AC power source is nominally 240 volts with respect to each other phase.

21. The system of claim 17, wherein the voltage of each phase of the multi-phase AC power source is nominally 200 volts with respect to each other phase.

22. A method for distributing power within an equipment rack, comprising:
   providing a rack connector within the equipment rack, the rack connector being usable to accommodate a first device installed in the equipment rack that uses one or more of a plurality of phases, and also usable to accommodate a second device installed in the equipment rack that uses one or more of the plurality of phases, thereby permitting the rack connector to couple to any of a plurality of devices, and permitting each of the plurality of devices to use any number of the plurality of phases;

wherein the number of phases used by the first device differs from the number of phases used by the second device.

23. The method of claim 22, further comprising:
connecting the first device to the rack connector;
disconnecting the first device from the rack connector; and
connecting the second device to the rack connector after disconnecting the first device.

* * * * *